(12) United States Patent
Waterson et al.

(10) Patent No.: US 6,214,516 B1
(45) Date of Patent: *Apr. 10, 2001

(54) PHOTOSENSITIVE RESIN COMPOSITIONS

(75) Inventors: Pamela J. Waterson, Northbridge, MA (US); Ahmad Naiini, Warwick, RI (US); Steve Lien-Chung Hsu, Tainan (TW); William D. Weber, Cranston, RI (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/535,914

(22) Filed: Mar. 24, 2000

Related U.S. Application Data

(63) Continuation-in-part of application No. 09/406,007, filed on Sep. 24, 1999.
(60) Provisional application No. 60/102,694, filed on Oct. 1, 1998.

(51) Int. Cl.[7] .............................. G03F 7/023; G03F 7/30
(52) U.S. Cl. .......................... 430/191; 430/192; 430/193; 430/270.1; 430/326
(58) Field of Search ..................................... 430/191, 192, 430/193, 270.1, 326

(56) References Cited

U.S. PATENT DOCUMENTS

| | | | |
|---|---|---|---|
| 4,395,482 | 7/1983 | Ahne et al. | 430/326 |
| 5,037,720 | 8/1991 | Khanna | 430/190 |
| 5,449,584 | 9/1995 | Banba et al. | 430/190 |

*Primary Examiner*—John S. Chu
(74) *Attorney, Agent, or Firm*—Ohlandt, Greeley, Ruggiero & Perle, LLP

(57) ABSTRACT

A positive photosensitive resin composition comprising (a) a silane diol such as diarylsilane diol or dialkylsilane diol, (b) one or more polybenzoxazole precursors having the structure:

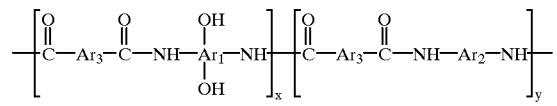

wherein $Ar_1$ is a tetravalent aromatic group, aliphatic group, heterocyclic group, or mixtures thereof; $Ar_2$ is a divalent aromatic, heterocyclic, alicyclic, or aliphatic group that optionally may contain silicon; $Ar_3$ is divalent aromatic group, aliphatic group, heterocyclic group, or mixtures thereof; (c) a photosensitive agent, and (d) a solvent. The composition optionally includes an adhesion promoter, leveling agent, or mixtures thereof.

22 Claims, No Drawings

PHOTOSENSITIVE RESIN COMPOSITIONS

This application is a continuation-in-part of U.S. patent application Ser. No. 09/406,007, filed on Sep. 24, 1999, which was allowed on Dec. 20, 1999, which claims priority from U.S. Provisional Application Serial No. 60/102694 filed on Oct. 1, 1998.

FIELD OF THE INVENTION

The present invention relates to positive photosensitive resin compositions. More specifically, the present invention relates to positive-working, aqueous base developable photosensitive polybenzoxazole (PBO) precursor compositions that are suitable for applications in the field of microelectronics.

BACKGROUND OF THE INVENTION

In microelectronic applications, polymers that demonstrate high temperature resistance are generally well known. Precursors of such polymers, such as polyirnides and polybenzoxazoles can be made photoreactive with suitable additives. The precursors are converted to the desired polymer by known techniques such as exposure to high temperatures. The polymer precursors are used to prepare protective layers, insulating layers, and relief structures of highly heat-resistant polymers.

Conventional positive-working photosensitive polybenzoxazoles (PBO) contain an alkaline soluble PBO precursor and a diazoquinone photoactive compound as shown in U.S. Pat. No. 4,371,685. The diazoquinone compound inhibits the solubility of the PBO precursor in an aqueous base. After exposure to light, the diazoquinone compound undergoes photolysis and converts to indenecarboxylic acid, which promotes the aqueous base solubility of the PBO precursor.

SUMMARY OF THE INVENTION

The present invention provides a positive photosensitive resin composition containing a silane diol such as diarylsilane diol or dialkylsilane diol, one or more polybenzoxazole precursors, a photosensitive agent (e.g. diazoquinone compound, dihydropyridine, or mixtures thereof), and a solvent.

In the present invention, a silane diol compound is an essential component of the positive acting, photoactive resin composition. In the present invention, the silane diol surprisingly acts as a dissolution inhibitor. This behavior is contrary to what one would expect, since in other systems such as those described in U.S. Pat. No. 5,856,065, a silane diol functions as a dissolution enhancer.

The present invention provides a positive photosensitive resin composition comprising a silane diol, one or more polybenzoxazole precursors, a photosensitive agent, and a solvent. The composition of the present invention exhibits several improvements over prior art compositions. For example, dissolution inhibition and crack resistance are noticeably improved. Furthermore, there is a decrease in swelling and skinning during exposure to aqueous developers, as compared to other compositions at a similar inhibition level. These improvements allow longer, more controlled development times resulting in increased develop process latitude.

DETAILED DESCRIPTION OF THE INVENTION

The positive photosensitive resin composition of the present invention contains (a) a silane diol such as diarylsilane diol or dialkylsilane diol, (b) one or more polybenzoxazole precursors, (c) a photosensitive agent (e.g. diazoquinone compound, dihydropyridine, or mixtures thereof), and (d) a solvent.

The silane diol compound can be, for example, a diarylsilane diol or a dialkylsilane diol, or mixtures thereof. Most preferred is a diphenylsilane diol. The silane diol is included in the composition at about 0.1 wt. % to 10.0 wt. %, preferably at about 0.5 wt. % to 7.5 wt. %, and most preferably at about 1 wt. % to 5 wt. %.

The photosensitive resin composition has one or more polybenzoxazole precursors having the structure shown in (D):

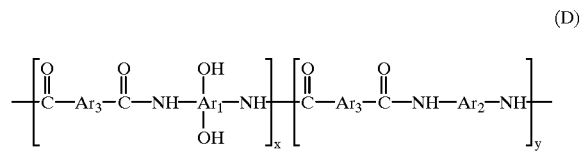

(D)

The polybenzoxazole precursor has a polymerization degree of 10–1000 and is synthesized by the reaction of monomers (A), (B), and (C) in the presence of a base:

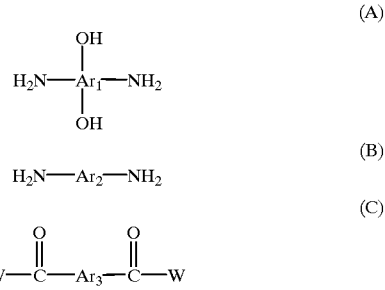

wherein x is 10 to 1000, and y is 0 to 900; $Ar_1$ is a tetravalent aromatic, aliphatic, or heterocyclic group; $Ar_2$ is a divalent aromatic, heterocyclic, alicyclic or aliphatic group; $Ar_3$ is a divalent aromatic, aliphatic or heterocyclic group, and W is Cl, OR and H; wherein R is an alkyl group such as —$CH_3$, —$C_2H_5$, n-$C_3H_7$, i-$C_3H_7$, n-$C_4H_9$, t-$C_4H_9$, or a cyclohexyl group.

The ratio of [(A)+(B)]/(C) is generally between about 0.9 to 1.1. Monomer (A) is about 10–100 mole % of [(A)+(B)] and monomer (B) is about 0–90 mole % of [(A)+(B)].

In monomer (A), which is a constituent of polymer (D), $Ar_1$ is a tetravalent aromatic, aliphatic, or heterocyclic group, and can include the following moieties:

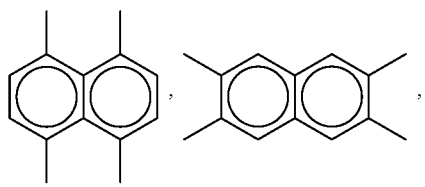

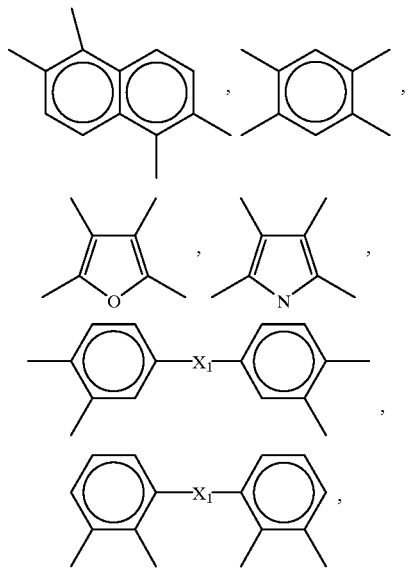

wherein X₁ is —O—, —S—, —C(CF₃)₂—, —CH₂—,

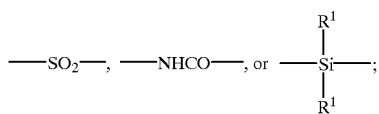

—SO₂—, —NHCO—, or —Si(R¹)(R¹)—;

$R^1$ is alkyl or cycloalkyl, such as —CH₃, —C₂H₅, n-C₃H₇, i-C₃H₇, n-C₄H₉, t-C₄H₉, cyclohexyl, and the like. However, Ar₁ is not restricted to these groups. Furthermore, monomer (A) may be a mixture of two or more monomers.

In monomer (B), which is a constituent of polybenzoxazole precursor (D), Ar₂ is a divalent aromatic, heterocyclic, alicyclic, or aliphatic group that may or may not contain silicon. The Ar₂ containing monomer (B) includes, for example, 5(6)-diamino-1-(4-aminophenyl)-1,3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 3,3'-diaminodiphenylmethane, 4,4'-diaminodiphenylmethane, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis (4-aminophenoxy) benzene, 1,3-bis(3-amino-phenoxy) benzene, 1,4-bis (γ-aminopropyl) tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminidodecane, 1,12-diaminooctadecane, 2,17-diaminoeicosane, 3,3'-dimethyl-4,4'-diaminodiphenylmethane, bis(4-aminocyclohexyl) methane, 3,3'-diaminodiphenylethne, 4,4'-diaminodiphenylethne, and 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, piperazine, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline), 3,3'sulfonyl-dianiline, 3,3'sulfonyl-dianiline, and mixtures thereof. However, it should be understood that monomer (B) is not restricted to these compounds.

In monomer (C), which is a constituent of polybenzoxazole precursor (D), Ar₃ is a divalent aromatic or heterocyclic group, and includes, for example:

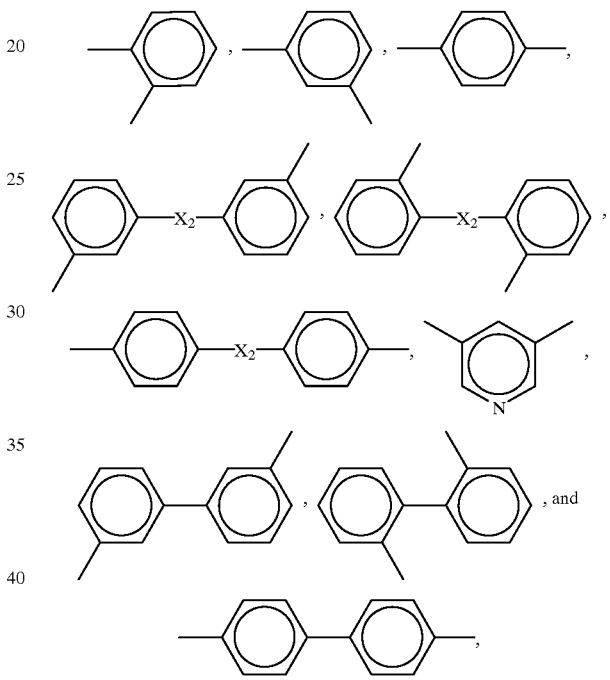

wherein X₂ is —O—, —S—, —C(CF₃)₂—, —CH₂—, —SO₂—, or —NHCO—. However, Ar₃ is not restricted to these groups. Furthermore, monomer (C) may be a mixture of two or more monomers.

The preferred reaction solvents are N-methyl-2-pyrrolidone (NMP), γ-butyrolactone (GBL), N,N-dimethylformamide (DMF), N,N-dimethylacetamide (DMAc), dimethyl-2-piperidone, dimethylsulfoxide (DMSO), sulfolane, and diglyme. Most preferred are N-methyl-2-pyrrolidone (NMP) and γ-butyrolactone (GBL).

Any suitable reaction for reacting such dicarboxylic acid or its dichloride or diester with at least one aromatic and/or heterocyclic dihydroxydiamine, and optionally, with at least one diamine may be used. Generally, the reaction is carried out at about 10° C. to about 50° C. for about 6 to 48 hours. The molar ratio of diacid to (diamine+dihydroxydiamine) should be about 0.9–1.1:1.

The positive photosensitive resin composition includes one or more polybenzoxazole precursors at about 10 wt. % to 50 wt. %. Preferably, about 20 wt. % to 45 wt. %, and most preferably, about 25 wt. % to 40 wt. % of the polybenzoxazole precursor is present in the composition.

The photosensitive agent of the photosensitive resin composition of the present invention can be, for example, a diazoquinone compound (E), dihydropyridine compound (F), or mixtures thereof. Suitable diazoquinone compounds (E) can be, but are not limited to, one of the following structures:
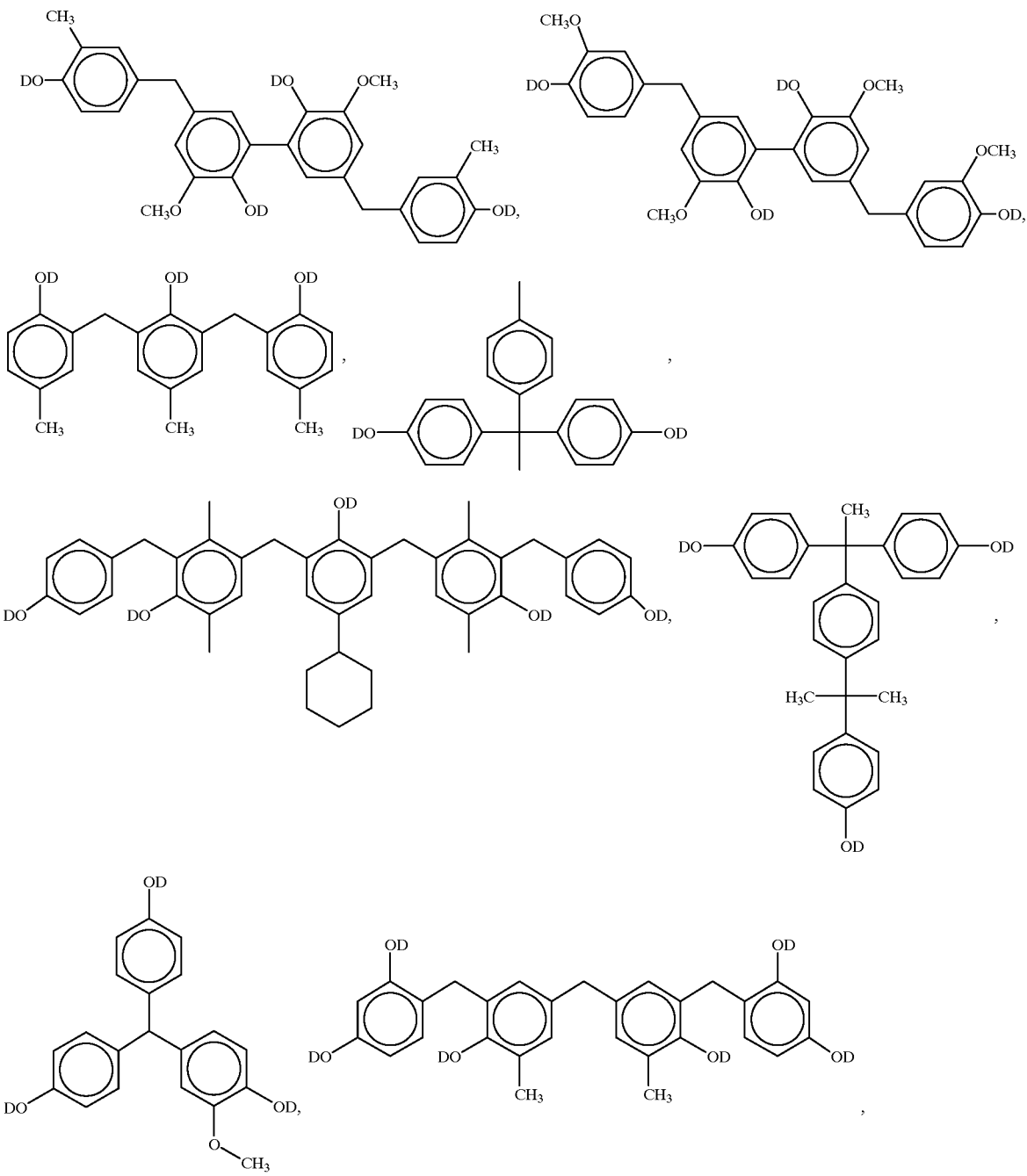

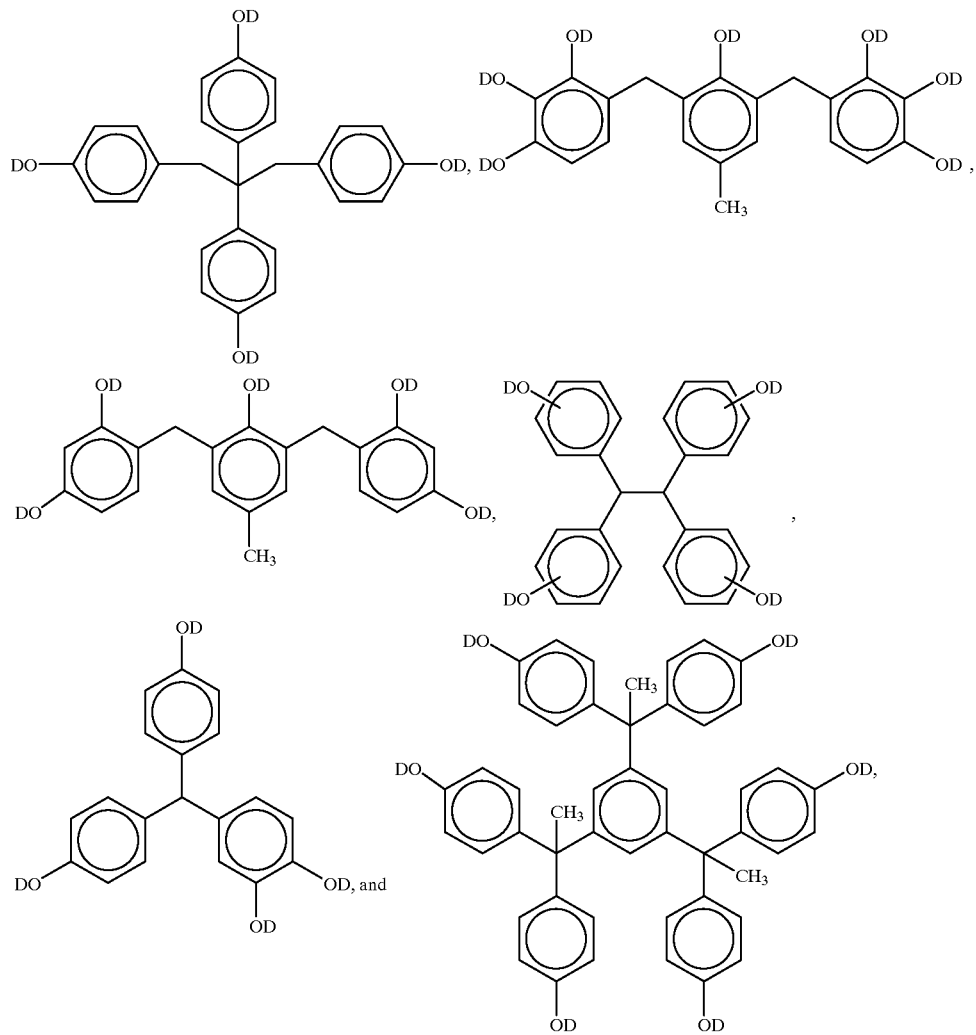
wherein D independently can be H or one of the following moieties:
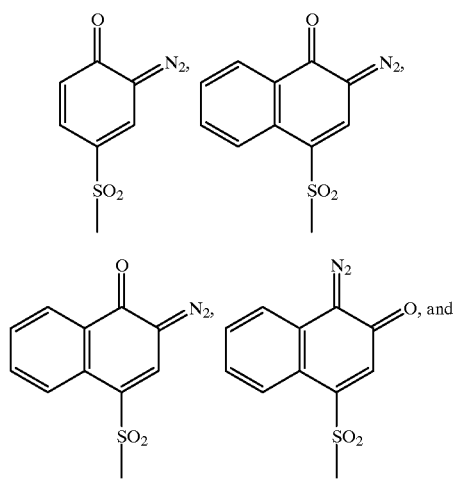
provided, however, in each compound at least one D is not H.
The dihydropyridine (F) can be, for example, a compound with the following structure:

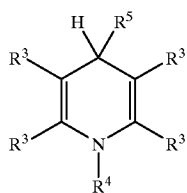

wherein R³ groups are the same or different and have the following structure: H, OH, COO—(CH₂)ₙ—CH₃, (CH₂)ₙ—CH₃, O—(CH₂)ₙ—CH₃, CO—(CH₂)ₙ—CH₃, (CF₂)ₙ—CF₃, C₆H₅, COOH, (CH₂)n—O—(CH₂)m—CH₃, (CH₂)ₙ—OH, CH₂=CH—CH₂)ₚ—CO—CH₂, F, Cl, Br or I; m=0 to 10, n=0 to 10, and p=0 to 4; R⁴ is H, C₁–C₇ alkyl, cycloalkyl, or phenyl and mono substituted phenyl; R⁵ is

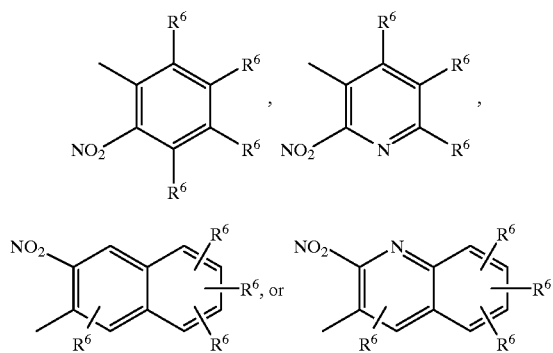

wherein R⁶ is defined the same as R³ and the NO₂ group is in the ortho position in respect to the dihydropyridine ring.

For example, the dihydropyridine may be:

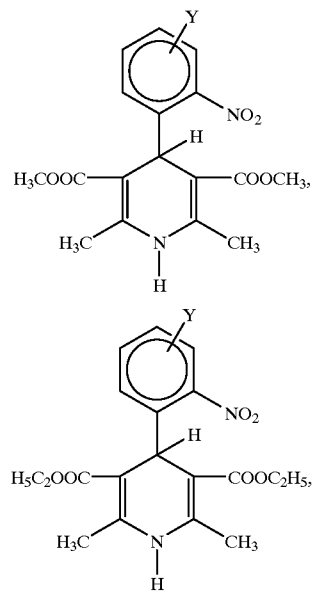

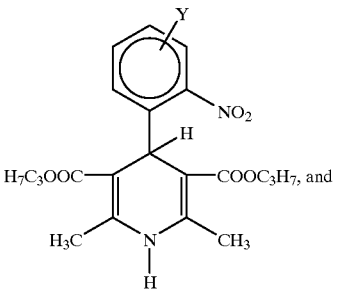

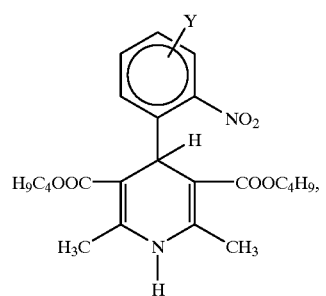

wherein, Y is —OR² where R² is a monovalent substituted or unsubstituted aromatic group or aliphatic group, CN, Cl, Br, or I.

Polybenzoxazole precursor (D) can be formulated with one or more diazoquinone compounds (E), one or more dihydropyridines (F), or mixtures thereof The diazoquinone compound (E) used in this composition is about 1 wt. % to 20 wt. % of the total weight of the composition, preferably, about 2 wt. % to 10 wt. %, and most preferably, about 3 wt. % to 8 wt. %. The amount of dihydropyridine compound (F) used in this composition is about 1 wt. % to 20 wt. % of the total weight of the composition, preferably, about 2 wt. % to 10 wt. %, and most preferably, about 3 wt. % to 8 wt. %. If both the diazoquinone compound (E) and the dihydropyridine compound (F) are used, the amount of (E)+(F) in this composition is about 1 wt. % to 20 wt. % of the total weight of the composition, preferably, about 2 wt. % to 10 wt. %, and most preferably, about 3 wt. % to 8 wt. %.

The positive acting, photoactive resin of this invention is used in a solution dissolved in a solvent. Suitable solvents include, but are not limited to organic solvents, such as N-methylpyrrolidone (NMP), γ-butyrolactone (GBL), N,N-dimethylacetamide (DMAc), dimethyl-2-piperidone, N,N-dimethylformamide (DMF), and mixtures thereof The preferred solvents are γ-butyrolactone and N-methylpyrrolidone with γ-butyrolactone being the most preferred.

The present invention may fuirther include additives. Suitable additives are, for example, adhesion promoters such as aminosilanes, leveling agents, mixtures thereof, and the like.

In addition, the present invention includes a process for forming a relief pattern. The process comprises the steps of: (a) coating on a suitable substrate, a positive-working photosensitive composition comprising a silane diol, one or more polybenzoxazole precursors having the structure (D), a photosensitive agent, and a solvent, thereby forming a coated substrate; (b) exposing the coated substrate to actinic radiation; (c) post exposure baking the coated substrate at an elevated temperature; (d) developing the coated substrate with an aqueous developer, thereby forming a developed substrate; (e) rinsing the developed substrate; and (e) baking the rinsed substrate at an elevated temperature, thereby curing the relief pattern.

The positive acting, photoactive composition of this invention is coated on a suitable substrate such as a silicon wafer, a ceramic substrate, or the like. Coating methods include, but are not limited to spray coating, spin coating, offset printing, roller coating, screen printing, extrusion coating, meniscus coating, curtain coating, and immersion coating. The resulting film may optionally be prebaked at an elevated temperature of about 70–120° C. for several minutes to half an hour, depending on the method, to evaporate the remaining solvent. Subsequently, the resulting dry film is exposed to actinic rays in a preferred pattern through a mask. X-rays, electron beam, ultraviolet rays, visible light, and the like can be used as actinic rays. The most preferable rays are those with wavelength of 436 nm (g-line) and 365 nm (i-line).

Following exposure to actinic radiation, it is advantageous to heat the coated substrate to a temperature between about 70° C. and 120° C. The coated substrate is heated in this temperature range for a short period of time, typically several seconds to several minutes. This process step is commonly referred to in the art as post exposure baking.

The film is developed using an aqueous developer and a relief pattern is obtained. The aqueous developer includes the solution of alkalis such as an inorganic alkali (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcohol-amines (e.g. triethanolamine), quaternary ammonium salts (e.g., tetramethylammonium hydroxide, tetraethylammonium hydroxide), and mixtures thereof. The most preferred developers are those containing tetramethylammonium hydroxide (TMAH). An appropriate amount of a surfactant can be added to the developer. Development can be carried out by means of immersion, spray, puddling, or other similar developing methods.

The relief pattern is then rinsed using deionized water. The oxazole ring is then formed by curing of the relief pattern to obtain the final pattern of high heat resistant polymer. Curing is performed by baking the developed substrate at or above the glass transition temperature $T_g$ of the polymer to obtain the oxazole ring that forms a final pattern of high heat resistance.

To illustrate the present invention, the following examples are provided. It should be understood that the present invention is not limited to the examples described.

Synthesis Example A

To a 2 L, three-necked, round bottom flask equipped with a mechanical stirrer, nitrogen inlet and addition funnel, 155.9 g (426.0 mmol) of hexafluoro-2,2-bis(3-amino-4-hydroxyphenyl)propane, 64.3 g (794.9 mmol) of pyridine, and 637.5 g of N-methylpyrrolidone (NMP) were added. The solution was stirred at room temperature until all solids dissolved, then cooled in an ice water bath at 0–5° C. To this solution, 39.3 g (194 mmol) of isophthalyl chloride, and 56.9 g (194 mmol) of 1,4-oxydibenzoyl chloride dissolved in 427.5 g of NMP, were added drop-wise. After the addition was completed, the resulting mixture was stirred at room temperature for 18 hours. The viscous solution was precipitated in 10 liters of vigorously stirred de-ionized water. The polymer was collected by filtration and washed with de-ionized water and a water/methanol (50/50) mixture. The polymer was dried under vacuum conditions at 105° C. for 24 hours.

The yield was almost quantitative and the inherent viscosity of the polymer was 0.24 dL/g measured in NMP at a concentration of 0.5 g/dL at 25° C.

EXAMPLE 1

A photosensitive formulation of the following composition was prepared: 100 parts by weight of the PBO precursor of Synthesis Example A, 25 parts of a photoactive compound or PAC, 0.7 parts adhesion promoter, and 5 parts diphenylsilane diol were dissolved in 233 parts GBL solvent to obtain a photosensitive resin composition. This composition was then spin coated onto a silicon wafer and baked on a hotplate for 3 minutes at 120° C. to obtain a film of about 10 $\mu$m in thickness. This film was exposed on an i-line stepper and then developed for 70 seconds using a 0.262N aqueous TMAH solution followed by rinsing with deionized water to provide a relief pattern. The exposure energy to clear was 800 mJ/cm$^2$ with a dark or unexposed film thickness retention of 88.5%. The dark film dissolution rate value Rmin, was 0.98 $\mu$m/min. No cracking, peeling, or skinning of the film was observed during image development.

EXAMPLE 2

A photosensitive formulation of the following composition was prepared: 100 parts by weight of the PBO precursor of Synthesis Example A, 25 parts PAC, 0.7 parts adhesion promoter, and 5 parts diphenylsilane diol were dissolved in 233 parts of GBL solvent to obtain a photosensitive resin composition. The composition was then spin coated onto a silicon wafer and baked on a hotplate for 3 minutes at 120° C. to obtain a film of about 9.9 $\mu$m in thickness. This film was exposed on an iline stepper and then developed for 90 seconds using a 0.28N aqueous TMAH solution followed by rinsing with deionized water to provide a relief pattern. The exposure energy to clear was 580 mJ/cm$^2$ with a dark film thickness retention of 80.7%, and a $R_{min}$ value of 1.27 $\mu$m/min. No cracking, peeling, or skinning of the film was observed during image development.

EXAMPLE 3

A photosensitive formulation of the following composition was prepared: 100 parts by weight of the PBO precursor of Synthesis Example A, 25 parts PAC, 0.7 parts adhesion promoter, and 5 parts diphenylsilane diol were dissolved in 233 parts GBL solvent to obtain a photosensitive resin composition. This composition was then spin coated onto a silicon wafer and baked on a hotplate for 3 minutes at 120° C. to obtain a film of about 12.5 $\mu$m in thickness. This film was exposed on an i-line stepper and then developed for 120 seconds using a 0.33N aqueous TMAH solution followed by rinsing in deionized water to provide a relief pattern. The exposure energy to clear was 380 mJ/cm$^2$ with a dark film thickness retention of 56.5%, and a $R_{min}$ value of 2.72 $\mu$m/min. No cracking, peeling, or skinning of the film was observed during image development.

COMPARATIVE EXAMPLE 1

A photosensitive formulation of the following composition was prepared: 100 parts by weight of the PBO precursor of Synthesis Example A, 25 parts PAC, and 0.7 parts adhesion promoter were dissolved into 233 parts GBL solvent to obtain a photosensitive resin composition. This composition was then spin coated onto a silicon wafer and baked on a hotplate for 3 minutes at 120° C. to obtain a film with a thickness of about 9.6 $\mu$m. This film was exposed on an i-line stepper and then developed for 70 seconds using a 0.262N aqueous TMAH solution followed by rinsing with deionized water to provide a relief pattern. The exposure energy to clear was 520 mJ/cm$^2$ with a dark film thickness retention of 79.2%, and a $R_{min}$ value of 1.71 μm/min. While no cracking, peeling, or skinning of the film was observed, the film showed a dark film dissolution rate 43% faster than the value observed in Example 1.

COMPARATIVE EXAMPLE 2

A photosensitive formulation of the following composition was prepared: 100 parts by weight of the PBO precursor from Synthesis Example A, 25 parts PAC, and 0.7 parts adhesion promoter were dissolved in 233 parts GBL solvent to obtain a photosensitive resin composition. This composition was then spin coated onto a silicon wafer and baked on a hotplate for 3 minutes at 120° C. to obtain a film with a thickness of about 9.7 μm. This film was exposed on an i-line stepper and then developed for 90 seconds using a 0.28N aqueous TMAH solution followed by rinsing with deionized water to provide a relief pattern. The exposure energy to clear was 300 mJ/cm$^2$ with a dark film thickness retention of 67%, and a $R_{min}$ value of 2.1 μm/min. While no cracking, peeling, or skinning of the film was observed, the film showed a dark film dissolution rate 67% faster than the value observed in Example 2.

COMPARATIVE EXAMPLE 3

A photosensitive formulation of the following composition was prepared: 100 parts by weight of the PBO precursor from Synthesis Example A, 25 parts PAC, and 0.7 parts adhesion promoter were dissolved into 233 parts GBL solvent to obtain a photosensitive resin composition. This composition was then spin coated onto a silicon wafer and baked on a hotplate for 3 minutes at 120° C. to obtain a film with a thickness of about 12.1 μm. This film was exposed on an i-line stepper and then developed for 120 seconds using a 0.33N aqueous TMAH solution followed by rinsing with deionized water to provide a relief pattern. The film was observed to crack and peel during image development. The degree of solubility inhibition in this composition is not as high as the degree of solubility inhibition observed in Example 3 (which used the same development process). Yet, unlike Example 3, the film from this composition exhibited excessive swelling and stress caused by the action of the TMAH solution during the development process causing the film to crack and peel during image development.

EXAMPLE 4

A photosensitive formulation of the following composition was prepared: 100 parts by weight of the PBO precursor synthesized according to procedure of Synthesis Example A having an inherent viscosity of 0.23 dL/g, 20 parts PAC, 1 part adhesion promoter, and 10 parts diphenylsilane diol were dissolved into 233 parts GBL solvent to obtain a photosensitive resin composition. This composition was then spin coated onto a silicon wafer and baked on a hotplate for 3 minutes at 120° C. to obtain a film with a thickness of about 10.5 μm. This film was exposed on an i-line stepper and was then developed for 90 seconds using a 0.262N aqueous TMAH solution followed by rinsing with deionized water to provide a relief pattern. A pattern resolution of 3 μm was obtained at an exposure dose of 590 mJ/cm$^2$ with a dark film retention of 84%, and a $R_{min}$ value of 1.12 μm/min. No cracking, peeling, or skinning of the film was observed.

EXAMPLE 5

A photosensitive formulation of the following composition was prepared: 100 parts by weight of the PBO precursor synthesized according to the procedure of Synthesis Example A having an inherent viscosity of 0.23 dL/g, 20 parts PAC, 1 part adhesion promoter, and 10 parts diphenylsilane diol were dissolved in 233 parts GBL solvent to obtain a photosensitive resin composition. This composition was then spin coated onto a silicon wafer and baked on a hotplate for 3 minutes at 120° C. to obtain a film with a thickness of about 10.6 μm. This film was exposed on an i-line stepper and then developed for 120 seconds using a 0.262N aqueous TMAH solution followed by rinsing with deionized water to provide a relief pattern. A pattern resolution of 3 μm was obtained using an exposure energy of 450 mJ/cm$^2$ with a dark film retention of 75.8%, and a $R_{min}$ value of 1.28 μm/min. No cracking, peeling, or skinning of the film was observed.

COMPARATIVE EXAMPLE 4

A photosensitive formulation of the following composition was prepared: 100 parts by weight of the PBO precursor synthesized according to procedure of Synthesis Example A having an inherent viscosity of 0.23 dL/g, 20 parts PAC, and 1 part adhesion promoter were dissolved into 233 parts GBL solvent to obtain a photosensitive resin composition. The composition was then spin coated onto a silicon wafer and baked on a hotplate for 3 minutes at 120° C. to obtain a film with a thickness of about 10.4 μm. This film was exposed on an i-line stepper and then developed for 40 seconds using a 0.262N aqueous TMAH solution followed by rinsing with deionized water to provide a relief pattern. A pattern resolution of 3 μm was obtained using an exposure dose of 670 mJ/cm$^2$ with a dark film retention of 81%, and a $R_{min}$ value of 2.96 μm/min. No cracking, peeling, or skinning of the film was observed.

COMPARATIVE EXAMPLE 5

A photosensitive formulation of the following composition was prepared: 100 parts by weight of the PBO precursor synthesized according to procedure of Synthesis Example A having an inherent viscosity of 0.23 dL/g, 20 parts PAC, and 1 part adhesion promoter were dissolved into 233 parts GBL solvent to obtain a photosensitive resin composition. This was then spin coated onto a silicon wafer and baked on a hotplate for 3 minutes at 120° C. to obtain a film with a thickness of about 10.4 μm. This film was exposed on an i-line stepper and then developed for 55 seconds using a 0.262N aqueous TMAH solution followed by rinsing with deionized water to provide a relief pattern. A resolution of 3 μm was obtained at an exposure dose of 440 mJ/cm$^2$ with a dark film retention of 73%, and a $R_{min}$ value of 3.05 μm/min. Comparison of the lithographic results described in Examples 4 and 5 with those described in Comparative Examples 4 and 5 show that inclusion of silane diol in the photosensitive composition results in improved latitude in the developing process.

The present invention has been described with particular reference to the preferred forms thereof. It will be obvious to one of ordinary skill in the art that changes and modifications may be made therein without departing from the spirit and scope of the present invention as defined by the following claims.

What is claimed is:

1. A positive photosensitive resin composition comprising:
   (a) a silane diol,
   (b) one or more polybenzoxazole precursors having the structure,

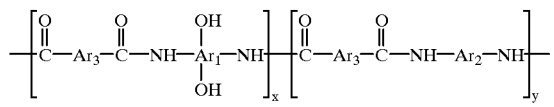

wherein $Ar_1$ is a tetravalent aromatic group, aliphatic group, heterocyclic group, or mixtures thereof; $Ar_2$ is a divalent aromatic, heterocyclic, alicyclic, or aliphatic group that optionally may contain silicon; $Ar_3$ is divalent aromatic group, aliphatic group, heterocyclic group, or mixtures thereof;

x is 10 to 1000 and y is 0 to 900;

(c) a photosensitive agent, and (d) a solvent.

2. The composition of claim 1, wherein said silane diol is about 0.1 wt. % to 10.0 wt. % of the total weight of said composition.

3. The composition of claim 1, wherein said silane diol is selected from the group consisting of diarylsilane diol, dialkylsilane diol, and mixtures thereof.

4. The composition of claim 3, wherein said silane diol is diphenylsilane diol.

5. The composition of claim 1, wherein said polybenzoxazole precursor is about 25 wt. % to 40 wt. %.

6. The composition of claim 1, wherein said polybenzoxazole precursor has a polymerization degree of 10–1000.

7. The composition of claim 1, wherein $Ar_1$ is hexafluoro propane-2,2-(biphenyl) radical and $Ar_3$ is a radical selected from the group consisting of a phthaloyl, or a 1,4-oxydibenzoyl, and mixtures thereof.

8. The composition of claim 1, wherein said photosensitive agent is about 2 wt. % to 10 wt. % of the total weight of said composition.

9. The composition of claim 1, wherein said photosensitive agent is selected from the group consisting of a diazoquinone compound, a dihydropyridine compound, and mixtures thereof.

10. The composition of claim 9, wherein said photosensitive agent is a diazoquinone compound with a structure selected from the group consisting of:

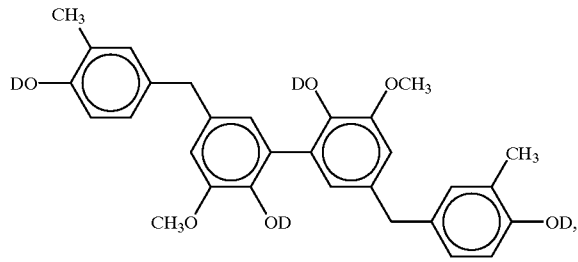

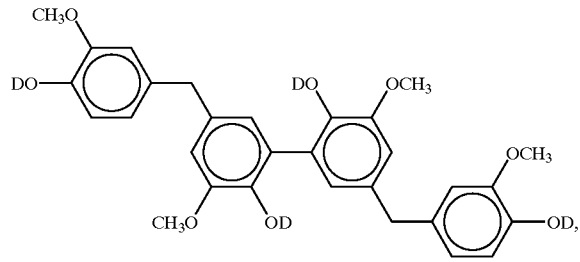

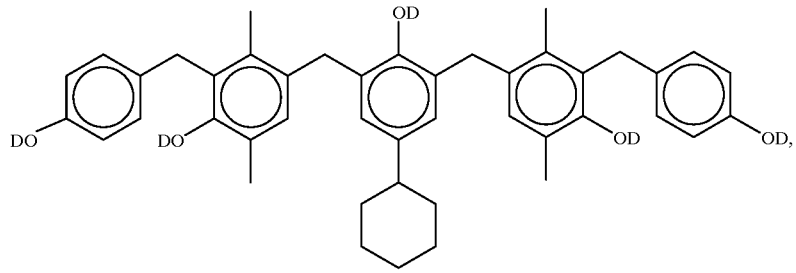

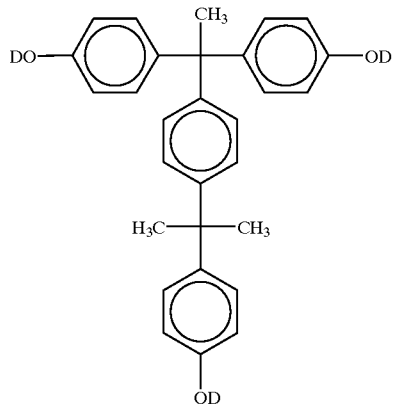

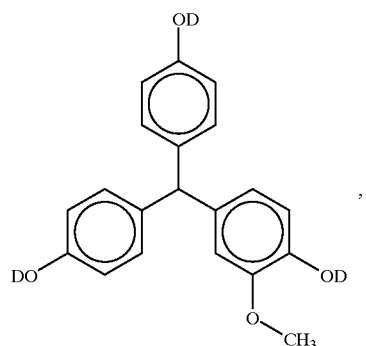

-continued
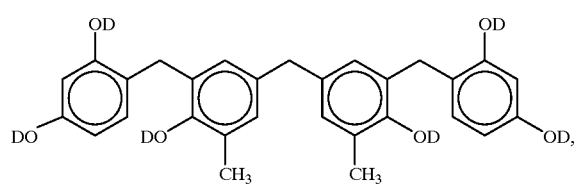
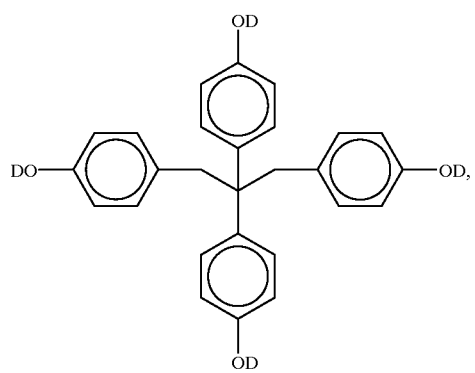
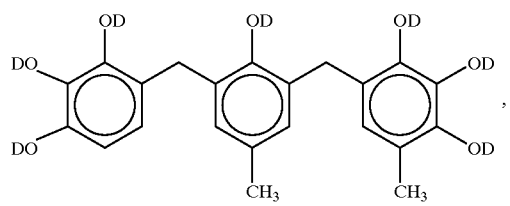
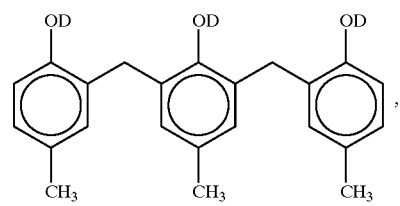
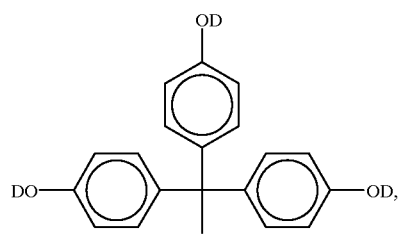
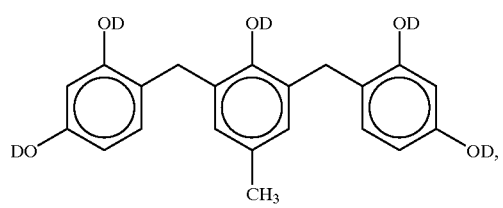
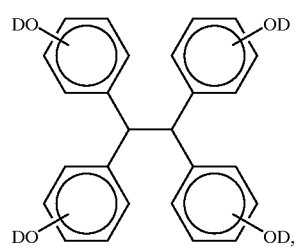
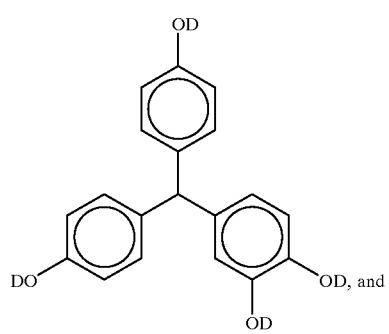

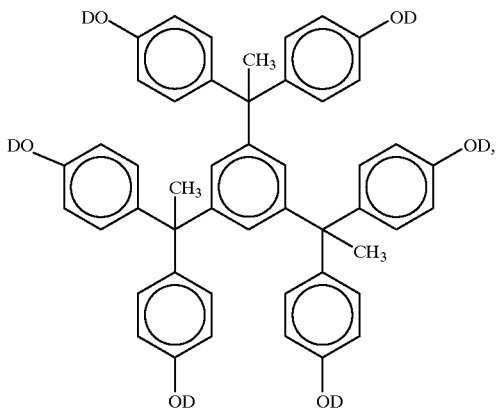

wherein D independently can be H or one of the following moieties:

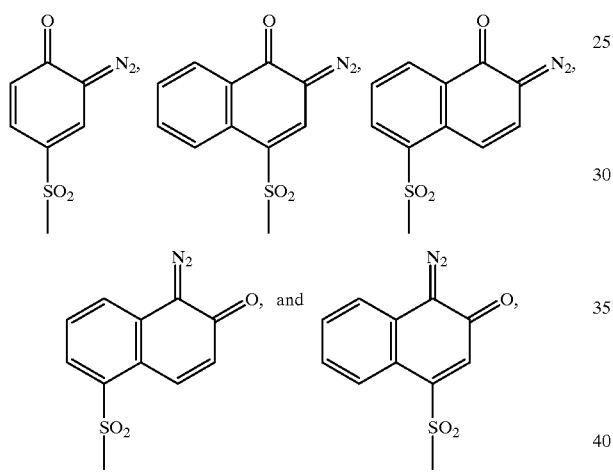

provided, however, in each compound at least one D is not H.

11. The composition of claim 9, wherein said photosensitive agent is a dihydropyridine compound having the structure:

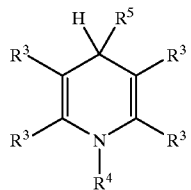

wherein $R^3$ groups are the same or different and have the following structure:

H, OH, COO—$(CH_2)_n$—$CH_3$, $(CH_2)_n$—$CH_3$, O—$(CH_2)_n$—$CH_3$, CO—$(CH_2)_n$—$CH_3$, $(CF_2)_n$—$CF_3$, $C_6H_5$, COOH, $(CH_2)n$—O—$(CH_2)m$—$CH_3$, $(CH_2)_n$—OH, $(CH=CH)_p$—CO—$CH_3$, F, Cl, Br or I;

m=0 to 10, n=0 to 10, and p=1 to 4;

$R^4$ is H, $C_1$–$C_7$ alkyl, cycloalkyl, or phenyl and mono substituted phenyl;

$R^5$ is

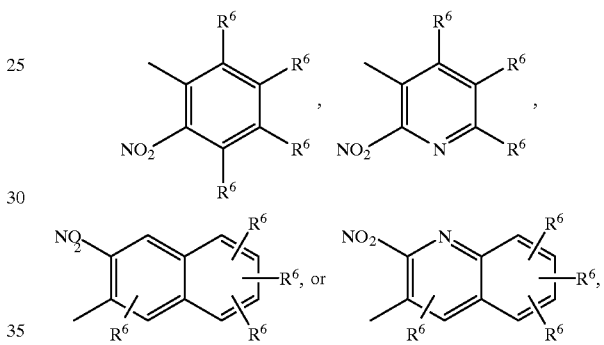

wherein $R^6$ is defined the same as $R^3$ and the $NO_2$ group is in the ortho position in respect to the dihydropyridine ring.

12. The composition of claim 11, wherein said photosensitive agent is a dihydropyridine compound with a structure selected from the group consisting of:

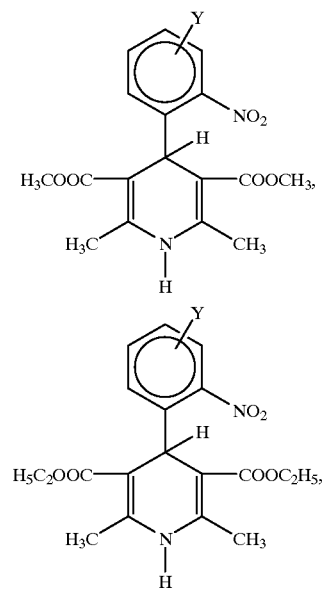

-continued

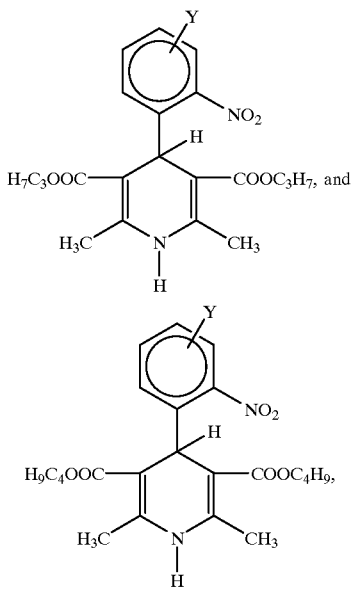

wherein, Y is —OR² where R² is a monovalent substituted or unsubstituted aromatic or aliphatic group, CN, Cl, Br, or I.

13. The composition of claim 1, wherein said solvent is selected from the group consisting of N-methylpyrrolidone, γ-butyrolactone, N,N-dimethylacetamide, dimethyl-2-piperidone, N,N-dimethylformamide, and mixtures thereof.

14. The composition of claim 13, wherein said solvent is γ-butyrolactone.

15. The composition of claim 1, further comprising one or more additives selected from the group consisting of adhesion promoters, leveling agents, and mixtures thereof.

16. A positive photosensitive resin composition comprising:

about 0.1 wt. % to about 10.0 wt. % of a silane diol; about 10 wt. % to about 50 wt. % of one or more polybenzoxazole precursors having the structure:

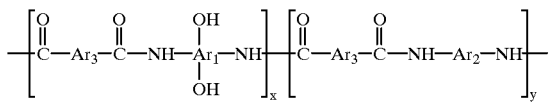

wherein $Ar_1$ is a tetravalent aromatic group, aliphatic group, heterocyclic group, or mixtures thereof; $Ar_2$ is a divalent aromatic, heterocyclic, alicyclic, or aliphatic group that may or may not contain silicon; $Ar_3$ is divalent aromatic group, aliphatic group, heterocyclic group, or mixtures thereof; and x is 10 to 1000 and y is 0 to 900; about 1 wt. % to about 20 wt. % of a photosensitive agent; and a solvent.

17. A process for forming a relief pattern, comprising the steps of:

a) coating on a substrate, a positive photosensitive resin composition comprising a silane diol, one or more polybenzoxazole precursors having the structure:

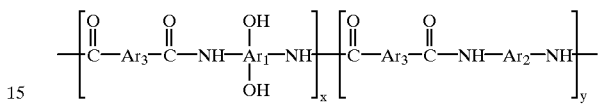

wherein $Ar_1$ is a tetravalent aromatic group, heterocyclic group, or mixtures thereof; $Ar_2$ is a divalent aromatic, heterocyclic, alicyclic, or aliphatic group that may or may not contain silicon; $Ar_3$ is divalent aromatic group, heterocyclic group, or mixtures thereof x is 10 to 1000; y is 0 to 900; and b is 0.10 to 350;

a photosensitive agent, and a solvent, thereby forming a coated substrate;

b) exposing said coated substrate to actinic radiation;

c) post exposure baking said coated substrate at an elevated temperature;

d) developing said coated substrate with an aqueous developer, thereby forming a developed substrate;

e) rinsing the developed substrate; and f) curing the rinsed substrate at an elevated temperature, thereby forming the relief pattern.

18. The process of claim 17, further comprising the step of prebaking said coated substrate, after said coated substrate is formed and before exposing said coated substrate.

19. The process of claim 17, wherein said actinic rays are selected from the group consisting of X-rays, electron beam rays, ultraviolet rays, and visible light rays.

20. The process of claim 17, wherein said actinic rays have a wavelength of 436 nm and 365 nm.

21. The process of claim 17, wherein said aqueous developer is a solution selected from the group consisting of alkalis, primary amines, secondary amines, tertiary amines, alcoholamines, quaternary ammonium salts, and mixtures thereof.

22. The process of claim 17, wherein said silane diol is diphenylsilane diol.

* * * * *